(12) United States Patent
Petroff et al.

(10) Patent No.: US 6,541,788 B2
(45) Date of Patent: *Apr. 1, 2003

(54) MID INFRARED AND NEAR INFRARED LIGHT UPCONVERTER USING SELF-ASSEMBLED QUANTUM DOTS

(75) Inventors: Pierre M. Petroff, Santa Barbara, CA (US); Naoto Horiguchi, Zama (JP)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,593

(22) Filed: Oct. 27, 1999

(65) Prior Publication Data

US 2002/0162995 A1 Nov. 7, 2002

Related U.S. Application Data

(60) Provisional application No. 60/105,793, filed on Oct. 27, 1998.

(51) Int. Cl.$^7$ ............................................... H01L 29/06
(52) U.S. Cl. ............................ 257/21; 257/12; 257/14; 257/17; 257/18; 257/22
(58) Field of Search ............................. 257/12, 14, 17, 257/18, 21, 22

(56) References Cited

U.S. PATENT DOCUMENTS

| | | | | | |
|---|---|---|---|---|---|
| 4,749,952 | A | * | 6/1988 | Morimoto | 330/4.3 |
| 5,510,627 | A | * | 4/1996 | Snow | 257/21 |
| 5,719,407 | A | * | 2/1998 | Ugajin | 257/21 |
| 5,734,174 | A | * | 3/1998 | Horiguchi | 257/17 |
| 6,031,245 | A | * | 2/2000 | Patel et al. | 257/25 |
| 6,074,892 | A | * | 6/2000 | Bowers et al. | 438/57 |
| 6,177,684 | B1 | * | 1/2002 | Sugiyama | 257/17 |
| 6,236,060 | B1 | * | 5/2002 | Chan et al. | 257/13 |
| 6,239,449 | B1 | * | 5/2002 | Fafard et al. | 257/17 |
| 6,403,985 | B1 | * | 6/2002 | Fan et al. | 257/88 |

FOREIGN PATENT DOCUMENTS

| | | | |
|---|---|---|---|
| JP | 10-12972 | * | 1/1998 |
| JP | 10-326906 | * | 12/1998 |
| JP | 11-121868 | * | 4/1999 |

OTHER PUBLICATIONS

L. Chu et al, "Polarization dependent photocurrent spectroscopy of InAs/GaAs quantum dots" Appl. Phys. Letters 75 (15), Oct. 11, 1999.*

(List continued on next page.)

Primary Examiner—Nathan J. Flynn
Assistant Examiner—Ahmed N. Sefer
(74) Attorney, Agent, or Firm—Gates & Cooper LLP

(57) ABSTRACT

A method and device for converting light from a first wavelength to a second wavelength. The method comprises the steps of exciting an electron in a quantum dot with an incident infrared photon having the first wavelength, the excited electron having a first energy, tunneling the excited electron through a barrier into a stress induced quantum dot, and recombining the excited electron with a hole in the stress induced quantum dot, therein producing a photon having the second wavelength, typically in the visible range. The device comprises a substrate, a spacer layer, coupled to the substrate, a second layer, coupled to the spacer layer, wherein the second layer comprises a different material than the spacer layer, a third layer, coupled to the second layer, wherein the third layer comprises at least one quantum dot, a fourth layer, coupled to the third layer, comprising a quantum well corresponding to each quantum dot in the third layer, a fifth layer, coupled to the fourth layer, wherein the fourth layer and fifth layer comprise a strain induced quantum dot corresponding to each quantum dot in the third layer; and a sixth layer, coupled to the fifth layer, the substrate and the sixth layer for contacting the device.

11 Claims, 7 Drawing Sheets

OTHER PUBLICATIONS

Spanen et al., "Red luminescence from strain–induced GaInP quantum dots" Appy. Phys. Lett. 69 (22), Nov. 25, 1996.*

Zhukov et al. Photo–and electroluminescence in the 1.3 um wavelength range from quantum–dot structures grown on GaAs substrates.*

B. Levine, J. Appl. Phys. 74, R1 (1993).
H.C. Liu et al., Electron. Lett. 31, 832 (1995).
M. Ershov, Appl. Phys. Lett. 72, 2865 (1998).
D. Leonard et al., Phys. Rev. B15, 50, 11687–11692 (1994).
J.Y. Marzin et al., Phys. Rev. Lett. 73, 716 (1994).
M. Grundman et al., Phys. Rev B 52, 11969 (1995).
S. Fafard et al., Surf. Sci. 361–362, 778 (1996).
V. Ryzhii, Semicond. Sci. Technol. 11, 759 (1996).
S. Maimon et al., Apply. Phys. Lett. 73, 2003 (1998).
S. Sauvage et al., Appl. Phys. Lett. 71, 2785 (1997).
E. Berryman et al., Appl. Phys. Lett. 70, 1861 (1997).
J.C. Phillips et al., Appl. Phys. Lett. 72, 2020 (1998).
D. Pan et al., Appl. Phys. Lett. 73, 1937 (1998).
J.H. Davies, J. Appl. Phys. 84, 1358 (1998).
M. Sopanen et al., Appl. Phys. Lett. 65, 1662 (1995).
W. Schoenfeld et al., "Charge . . . Dots," Proc. of the ICPS. Jerusalem, p. 5 (1998).
J.M. Garcia et al., Appl. Phys. Lett. 72, 3172 (1998).
S. Tsujino et al., J. Appl. Phys. 34, 5989 (1995).
M. Rufenacht et al., Appl. Phys. Lett. 70, 1128 (1997).

* cited by examiner

MID INFRARED AND NEAR INFRARED LIGHT UPCONVERTER USING SELF-ASSEMBLED QUANTUM DOTS

CROSS-REFERENCE TO RELATED APPLICATIONS

This application claims priority under 35 U.S.C. 119(e) to U.S. Provisional Patent Application No. 60/105,793, filed Oct. 27, 1998, entitled "MID-AND FAR INFRARED TO NEAR INFRARED LIGHT CONVERTER USING INAS SELF-ASSEMBLED QUANTUM DOTS," by Pierre M. Petroff et al., which application is incorporated by reference herein.

BACKGROUND OF THE INVENTION

1. Field of the Invention.

This invention relates generally to electronic devices, and more particularly to a mid and far infrared to near infrared light converter using InAs self-assembled quantum dots.

2. Description of Related Art.

Advances in the field of electronics have brought new means for the detection and use of infrared radiation in the mid-and far-infrared regions. The use of semiconductor materials has made the detection of infrared radiation more efficient and cost efficient. Even more compact and efficient means of detection and imaging in the infrared region of the spectrum can be devised using new semiconductor structures.

Large two-dimensional focal plane arrays in the mid- and far-infrared (M&FIR) region have important applications in the fields of pollution detection, thermal imaging, and imaging of astronomical objects. A typical approach for detecting M&FIR radiation uses indium antimonide (InSb) or mercury cadmium telluride (HgCdTe) detector arrays bonded to a silicon (Si) chip for multiplexing. However, this approach suffers because the difference in material thermal expansion coefficients makes it difficult to bond the detectors to the Si chip. Further, processing of HgCdTe or InSb is itself extremely complex and costly.

An alternative route has been the development of semiconductor quantum well infrared photodetectors (QWIP). More recently, QWIPs have been integrated to light emitting diodes (LEDs) and other electronics to produce a visible signal out of an infrared source. However, QWIPs have also fallen short of cheaply providing a reliable device because QWIPs are insensitive to normal incident light. The inter-sub-band transitions in a quantum well (QW) under normal illumination are forbidden due to selection rules for quantum wells. To avoid this problem in QWIPs, additional devices, such as special optics or surface gratings, are required to prevent normal illumination incident on the QWIP. Further, large lateral diffusion of photoexcited carriers in the QW deteriorate the spatial resolution of the QWIP imaging device. From the foregoing, it can be seen then that there is a need in the art for inexpensive, easily producible M&FIR detectors that can accept normal illumination.

SUMMARY OF THE INVENTION

To overcome the limitations in the prior art described above, and to overcome other limitations that will become apparent upon reading and understanding the present specification, the present invention discloses a method and device for light conversion. The proposed devices convert the signal from an IR or MIR source into a visible or near visible signal or image. This method of conversion is called upconversion since it converts low energy IR photons into visible or near visible photons.

The method comprises the steps of exciting an electron in a quantum dot with an incident photon having the first wavelength, typically in the infrared or near infrared range of the spectrum, the excited electron having a first energy, tunneling the excited electron through a barrier into a stress induced quantum dot, and recombining the excited electron with a hole in the stress induced quantum dot, therein producing a photon having a second energy and the second wavelength, typically in the visible or near visible range of the spectrum. The strain induced quantum dots may be replaced by another quantum dot with the appropriate dimensions.

The device comprises a substrate, a spacer layer, coupled to the substrate, a second layer, coupled to the spacer layer, wherein the second layer comprises a different material than the spacer layer, a third layer, coupled to the second layer, wherein the third layer comprises at least one quantum dot, a fourth layer, coupled to the third layer, comprising a quantum well corresponding to each quantum dot in the third layer, a fifth layer, coupled to the fourth layer, wherein the fourth layer and fifth layer comprise a strain induced quantum dot corresponding to each quantum dot in the third layer; and a sixth layer, coupled to the fifth layer, the substrate and the sixth layer for contacting the device. The quantum well layer may also be replaced by a layer of quantum dots.

Various advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples in accordance with the invention.

BRIEF DESCRIPTION OF THE DRAWINGS

Referring now to the drawings in which like numbers represent similar features throughout.

DETAILED DESCRIPTION OF THE PREFERRED EMBODIMENT

In the following description of the preferred embodiment, reference is made to the accompanying drawings which form a part hereof, and in which is shown by way of illustration the specific embodiment in which the invention may be practiced. It is to be understood that other embodiments may be utilized and structural and functional changes may be made without departing from the scope of the present invention.

Overview

Large two-dimensional focal plane arrays in the M&FIR region have important applications in the fields of pollution detection, thermal imaging, and astronomical imaging. One conventional approach uses InSb or HgCdTe detector arrays bonded to a Si multiplexing chip. However the difference in material thermal expansion coefficients makes it difficult to bond the detector to the Si chip. In addition, the processing of HgCdTe or InSb is itself complex and costly.

An alternative route has been the development of quantum well infrared photodetectors (QWIP). However, QWIPs have difficulty with normal incident light.

The device of the present invention converts the M&FIR light to near infrared (NIR) light or visible light using Quantum Dot Infrared Photodetectors (QDIPs). When a QDIP is combined with a charge coupled device (CCD) image sensor, the device of the present invention implements large two-dimensional focal plane arrays in the M&FIR region without complicated processing. The present invention uses a mature materials system based on gallium arsenide, indium arsenide, and aluminum arsenide compound semiconductors and avoids hybrid bonding and thermal mismatches, which reduces the cost of producing devices that perform in the M&FIR regions.

By using quantum dots (QDs) instead of QWs, the present invention uses zero dimensional carrier confinement and exciton localization to achieve extremely high spatial resolution. Moreover, the QDs based devices of the present invention are sensitive to normal incident infrared light since the selection rules for excitation of carriers is no longer forbidden. In addition, the quantum dots infrared photodetector (QDIP) has lower dark currents and higher gain compared to QWIP devices.

Device Structure

FIGS. 1A–1G illustrate the device of the present invention.

Figure 1A:
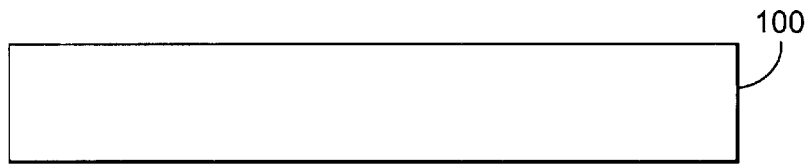
FIGS. 1A–1G illustrate the device of the present invention.

FIG. 1A illustrates substrate 100. Substrate 100 is typically gallium aluminum arsenide, and preferably in the form $Ga_{0.6}Al_{0.4}As$. However, substrate 100 can comprise other materials, such as gallium arsenide. Substrate 100, in one embodiment, is doped with n-type dopant materials relative to the material of substrate 100. Further, although described as a substrate, substrate 100 can be a grown or deposited layer on a wafer instead of a substrate material, such that layers can exist before substrate 100.

Figure 1B:
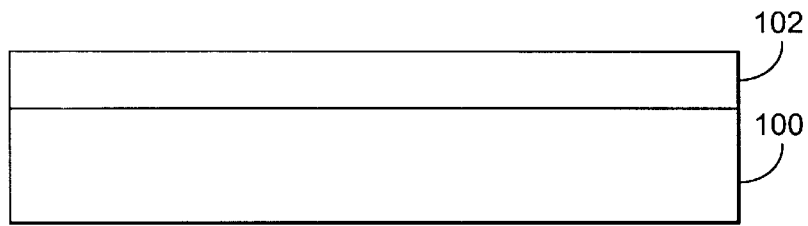

FIG. 1B illustrates substrate 100 with first layer 102. First layer 102 can be grown via epitaxial deposition, molecular beam epitaxy (MBE), metal-organic chemical vapor deposition (MOCVD), metal-organic molecular beam epitaxy (MOMBE), or other growth methods. First layer 102 is typically gallium aluminum arsenide, and preferably in the form $Ga_{0.8}Al_{0.2}As$ when substrate 100 is GaAs. However, first layer 102 can comprise other materials, such as gallium nitride, gallium indium phosphide, aluminum gallium arsenide, and silicon. First layer 102, in one embodiment, is intrinsic $Ga_{0.8}Al_{0.2}As$.

Figure 1C:
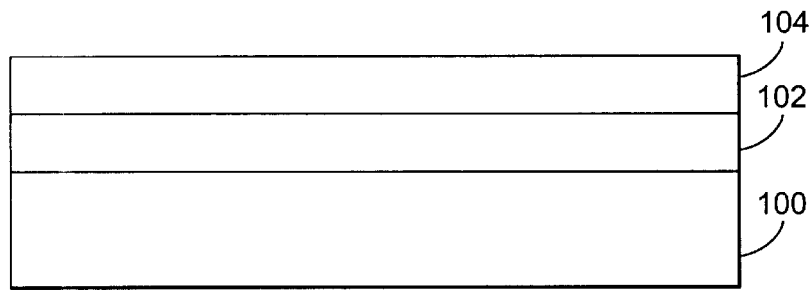

FIG. 1C illustrates substrate 100 with first layer 102 and second layer 104. Second layer 104 is also grown via MBE, MOCVD, MOMBE, or other growth methods. Second layer 104 is typically aluminum gallium arsenide ($Ga_{0.4}Al_{0.6}As$), but can be other materials, such as gallium nitride and gallium indium phosphide. Second layer 104, in one embodiment, is intrinsic $Ga_{0.4}Al_{0.6}As$.

Figure 1D:
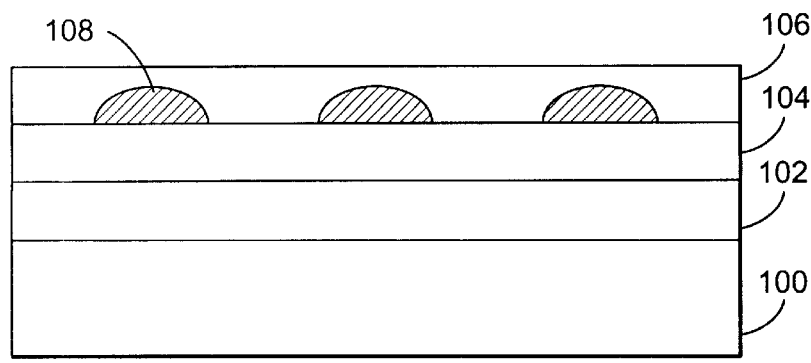

FIG. 1D illustrates substrate 100 with third layer 106. Third layer 106 is similar to second layer 104, but comprises one or more quantum dots 108 or quantum dot 108 layers. Quantum dots 108 are typically lens shaped, but can take any shape. Quantum dots 108 are formed by direct epitaxial deposition using a self assembling quantum dot technique described in U.S. Pat. No. 5,614,435, entitled "Self Assembled Quantum Dots," which is herein incorporated by reference. Further, MBE, MOCVD or MOMBE can also be used for depositing quantum dots 108. Quantum dots 108 are typically indium arsenide (InAs), but can be other materials such as indium phosphide, indium gallium aluminum arsenide, indium gallium nitride, and silicon germanium.

Figure 1E:
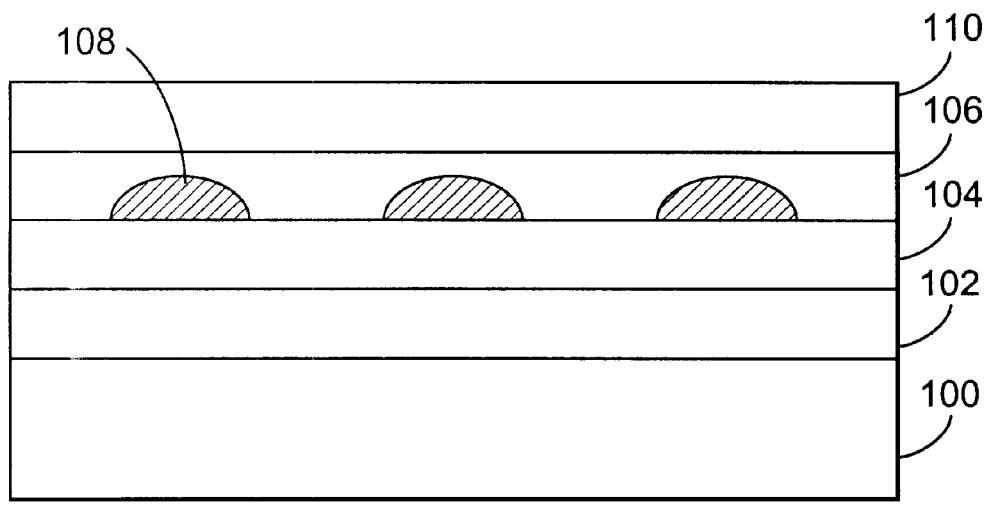

FIG. 1E illustrates fourth layer 110 coupled to third layer 106. Fourth layer 110 is typically gallium arsenide, but can be other materials, such as gallium nitride, and gallium indium phosphide. The distance between the quantum dot layer 108 and the quantum well should be small, e.g., below 12 nanometers, and therefore the third layer 106 should be thinner than 12 nanometers.

Figure 1F:
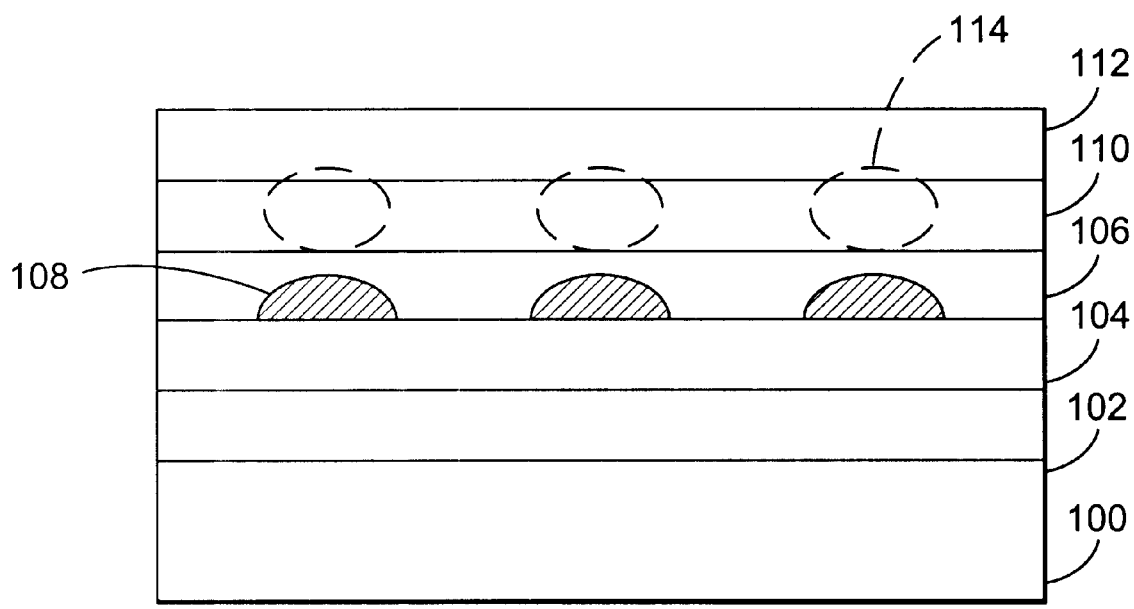

FIG. 1F illustrates fifth layer 112 coupled to fourth layer 110. Fifth layer 112 is typically intrinsic $Ga_{0.8}Al_{0.2}As$.

Figure 1G:
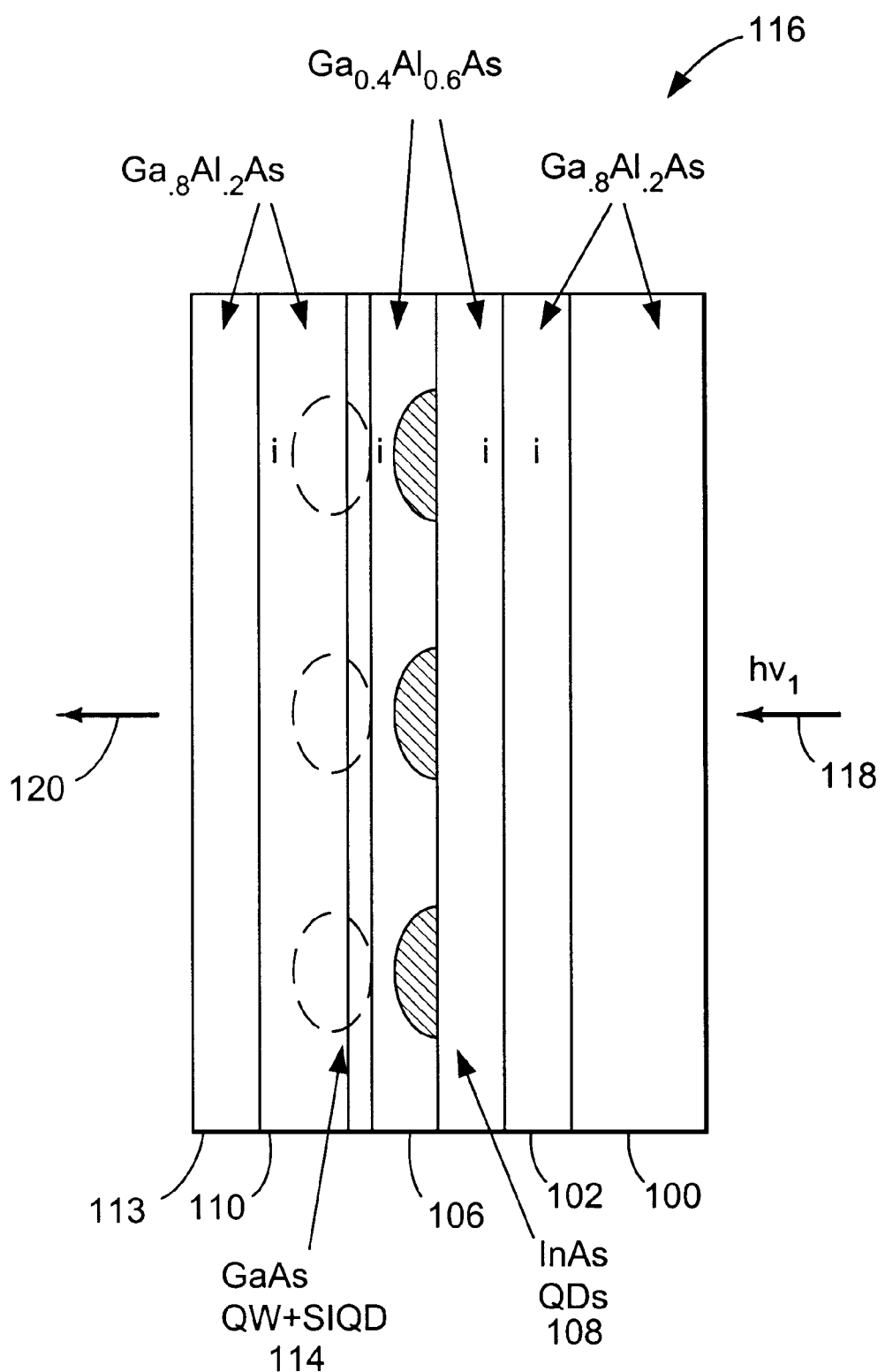

FIG. 1G illustrates sixth layer 113. Sixth layer 113 is typically $Ga_{0.8}Al_{0.2}As$. Sixth layer 113, in the preferred embodiment, is doped with p-type dopants.

As shown in FIGS. 1F and 1G, stress induced quantum dots 114 are induced in the layer 110 by the quantum dots 108, and specifically are induced in the GaAs quantum wells of layer 110. The strain field produced by quantum dots 108 create a deformation in the potential within layer 110, which creates a pseudo-depletion region, shown as the stress induced quantum dots 114. The stress induced quantum dots 114 are also formed by the piezopotential deformation resulting from the presence of quantum dots 108.

As the infrared photons 118 of energy $E_1 = h\upsilon_1$ are incident on the structure, the electrons which are filling up the quantum dots 108 are excited to the x minimum in the barrier layer 106. These electrons then relax to the quantum wells in layer 110 where they recombine with the holes which are localized in the stress induced quantum dot 114. This recombination of the excited electrons and the existing holes produce photons with energy $h\upsilon$. These photons have been "upconverted," and now produce light of a different wavelength 120, typically in the near infrared or visible light regions of the spectrum. The excited electrons can be assisted in their travel from quantum dot 108 to stress induced quantum dot 114 by placing a bias on device 116, but a voltage (potential bias) is not required. The upconversion process is illustrated by the band diagram shown in FIG. 2A.

Due to an applied voltage bias, the quantum dots 108 are filled with electrons while the stress induced quantum dots 114 are filled with holes. As such, device 116 will be able to detect M&FIR radiation without additional optical elements. Further, combining device 116 with other devices, such as CCDs, near infrared photodetectors, or other devices that can use the lower wavelength 120 light output from device 116, can produce numerous useful devices for directly forming upconverted images. This is possible because each quantum dot 108 and the associated stress induced quantum dot 114 acts as a detector and emitter, respectively. The carriers are localized and therefore the photon is emitted at the point of absorption of the infrared radiation.

Figure 2A:
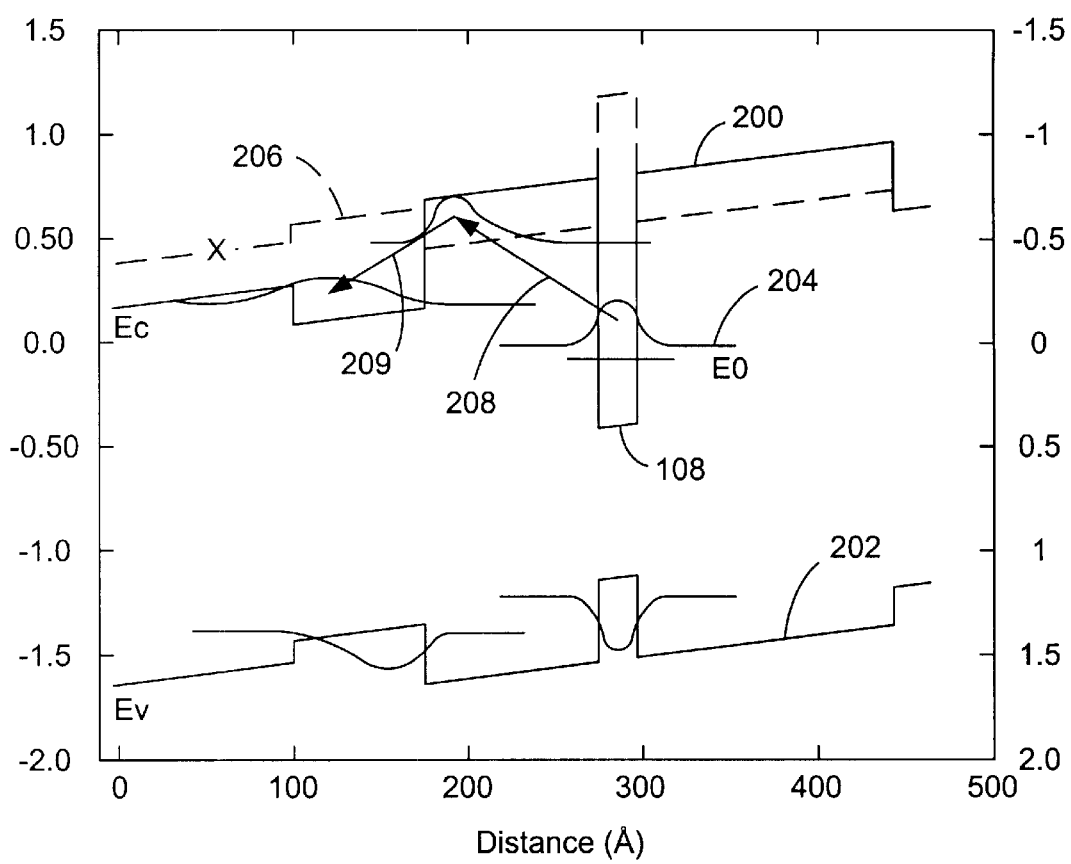
FIGS. 2A–2B illustrate the band diagrams of the device described in FIG. 1G.

In the computed band diagram of FIG. 2A, the conduction band 200 and valence band 202 are shown. The Fermi level 204 is at zero on the energy scale. The device bias is at ten volts. The bandedge for the x conduction band is shown as bandedge 206. The wave function for electrons and holes are computed and shown as indicated. The electron transfer from the quantum dot 108 to the stress induced quantum dots 114 is shown by arrows 208 and 209.

Figure 2B:
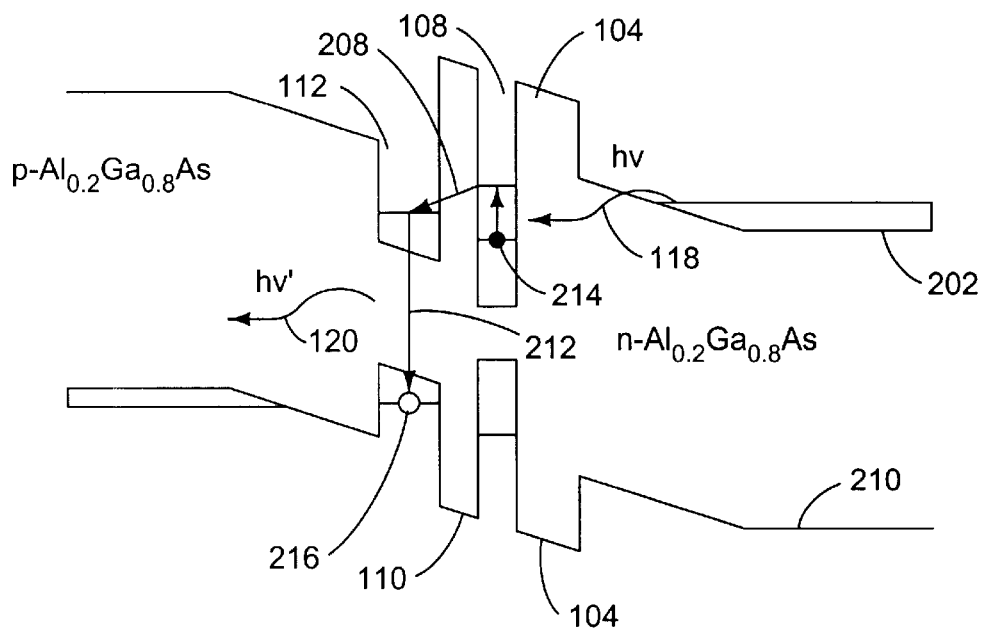

FIG. 2B shows in further detail the path of electrons through device 116. As first wavelength 118 excites electron 214 from a first energy state to a higher energy state within quantum dot 108, electron 214 now has enough energy to tunnel through barrier layer 110 to layer 112. As electron 214 recombines with hole 216 in the conduction Fermi band 210 via path 212, second wavelength 120 is produced by the release of energy of electron 214.

As an example, a device 116 in accordance with the present invention can have InAs quantum dots 108 and a GaAs layer 110 containing quantum wells between the substrate 100 and the sixth layer 113, which are typically contact layers for the device 116. Contact layers are typically doped with p-type and n-type dopants as discussed.

The GaAs quantum wells are positioned near the InAs quantum dots 108 to use the strain field of the InAs quantum dots 108 for modulating laterally the conduction and valence bands of the GaAs quantum wells. The strain induced deformation potential and piezopotential produces strain induced quantum dots (SIQDs) 114 in the GaAs quantum wells.

Under forward bias, electrons are injected into the quantum dots 108 and holes are injected into SIQDs 114. The electrons in the InAs quantum dots 108 are excited by the injected M&FIR light 118. The excited electrons in the InAs quantum dots 108 tunnel to the SIQDs 114 and recombine with the holes, which causes a near infrared light emission 120. By using SIQDs 114 inside the GaAs quantum wells, the wavelength of the light emission 120 can be tuned. The light emission 120 is emitted only from the SIQDs 114, not from the quantum wells or the quantum dots 108. As such, the quantum dot 108, and the associated SIQD 114, work as a detector-light converter pair, which leads to high spatial resolution because the excitation of the emission 120 is located only in the SIQD 114.

The device 116 is essentially a p-i-n structure that uses multiple layers in the intrinsic (i) portion of the structure to isolate the quantum dots 108 from the quantum wells, which comprise the SIQDs 114.

Experimental Apparatus

Figure 3:
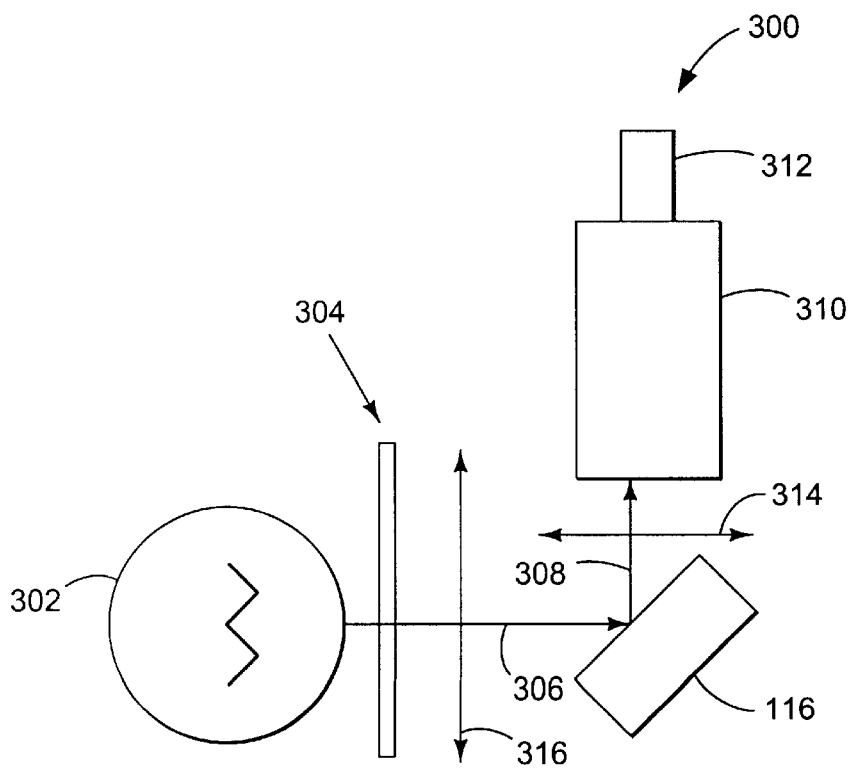
FIG. 3 illustrates the experimental test apparatus used to test the present invention.

FIG. 3 illustrates the experimental test apparatus used to test the present invention. Setup 300 illustrates a radiation source 302, which is typically a glow bar or other M&FIR source, that emits radiation in the infrared region. Filter 304 is placed at the output of radiation source 302 to limit the wavelengths of radiation that are incident on device 116. Filter 304 in the preferred embodiment is a pass band filter that allows transmission of radiation between five microns and 12 microns in wavelength.

Filtered infrared radiation 306 is incident on device 116, where the quantum dots 108 respond to the filtered infrared radiation 306, and the stress induced quantum dots 114 generate radiation 308, which is directed to a spectrometer 310 and detector 312 assembly. Device 116 can be positioned laterally and vertically as shown by movement arrows 314 and 316 to align device 116 with radiation source 302 and spectrometer 310.

Experimental Results

The devices 116 were grown by molecular beam epitaxy (MBE) on a semi-insulating GaAs (100) substrate. An underlying layer to substrate layer 100 is an AlAs/GaAs superlattice buffer (1 nm/1 nm, 20 pair), a substrate 100 (bottom contact layer) of 500 nm n-doped $Al_{0.2}Ga_{0.8}As$, doped with Si to a density of $1.5 \times 10^{19}$ cm$^{-3}$, a spacer layer of 20 nm $Al_{0.2}Ga_{0.8}As$, a 15 nm $Al_{0.6}Ga_{0.4}As$ barrier layer, an InAs dots layer, a 10 nm $Al_{0.6}Ga_{0.4}As$, barrier, a 7.5 nm GaAs quantum well, a spacer layer of 20 nm $Al_{0.2}Ga_{0.8}As$, a top contact layer of 500 nm p-doped $Al_{0.2}Ga_{0.8}As$, doped with carbon (C) to a density of $3 \times 10^{18}$ cm$^{-3}$, and a cap layer of 5 nm p-GaAs doped with C to a density of $3 \times 10^{18}$ cm$^{-3}$. To control the InAs dots dimensions, the partially covered island growth technique was used.

The device 116 was fabricated by conventional photolithography. It was isolated by a 2 mesa wet etching technique. The device size was 1×1 mm. The top ohmic contact comprises ring shaped nonalloyed Ti/Au. The bottom ohmic contact metal was AuGeNi/Au alloyed at 400 degrees Centigrade. A double monochromator 310 and a germanium (Ge) detector 312 were used to measure the electroluminescence from the device 116, which was mounted in a cryostat. A glowbar (blackbody) radiation source 302 was used as an infrared light source. Bandpass filter 304 between the glowbar source 302 and the device 116 allowed only the 5 to 12 micron infrared light to be incident at 45 degrees onto the device 116 surface.

Figure 4:
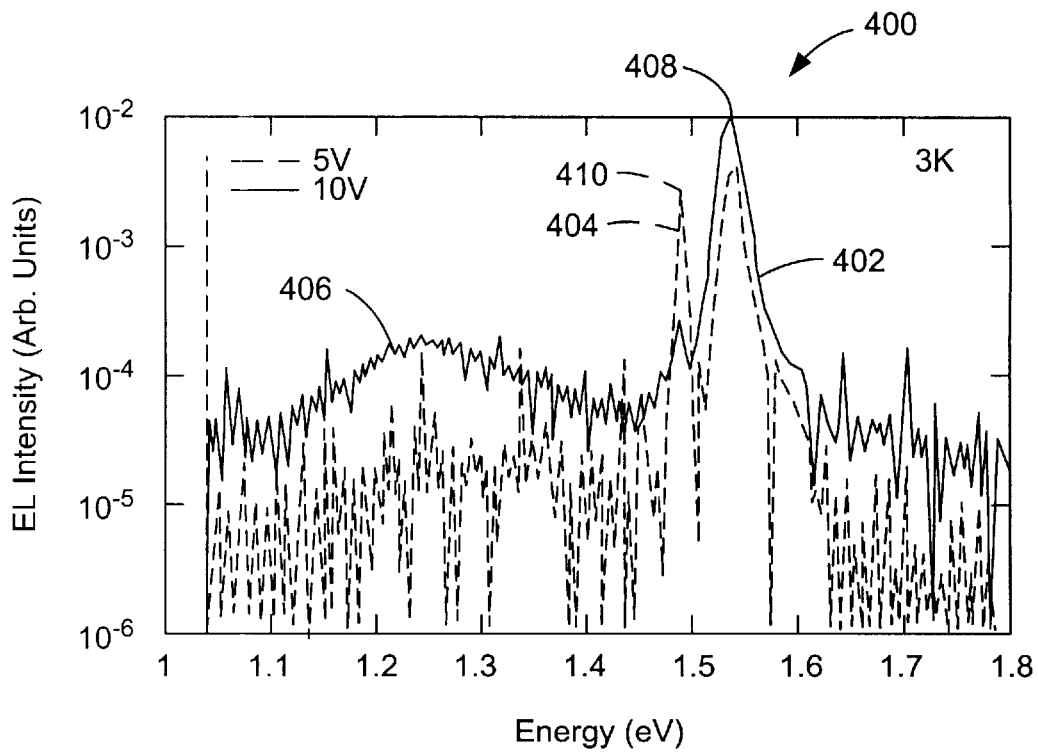
FIG. 4 illustrates the electroluminescence of the light converter of the present invention as function of photon energy.

FIG. 4 illustrates the electroluminescence of the light converter of the present invention as function of photon energy.

Electroluminescence graph 400 illustrates electroluminescence 402 at a ten volt bias and electroluminscence 404 at a five volt bias. The broad peak 406 around 1.25 eV corresponds to the InAs quantum dots 108 luminescence. The strong luminescence peak 408 at 1.55 eV comes from the GaAs SIQDs 114. The luminescence of the GaAs quantum well is not detected because of the efficient carrier capture by the SIQDs 114 induced in the quantum wells. Under a 5 V bias, the electroluminescence peak 410 from the GaAs stress induced quantum dots 114 at 1.49 eV was detected, and the electroluminescence of the InAs quantum dots 108 was not observed due to the suppression of hole tunneling from the GaAs SIQDs 114 to the InAs quantum dots 108 through the $Al_{0.6}Ga_{0.4}As$ barrier. At a bias larger than 7.5 V, the electrons and holes can move through or over the $Al_{0.6}Ga_{0.4}As$ barriers, and therefore the electroluminescence from both the GaAs SIQDs 114 and InAs quantum dots 108 are observed.

Figure 5:
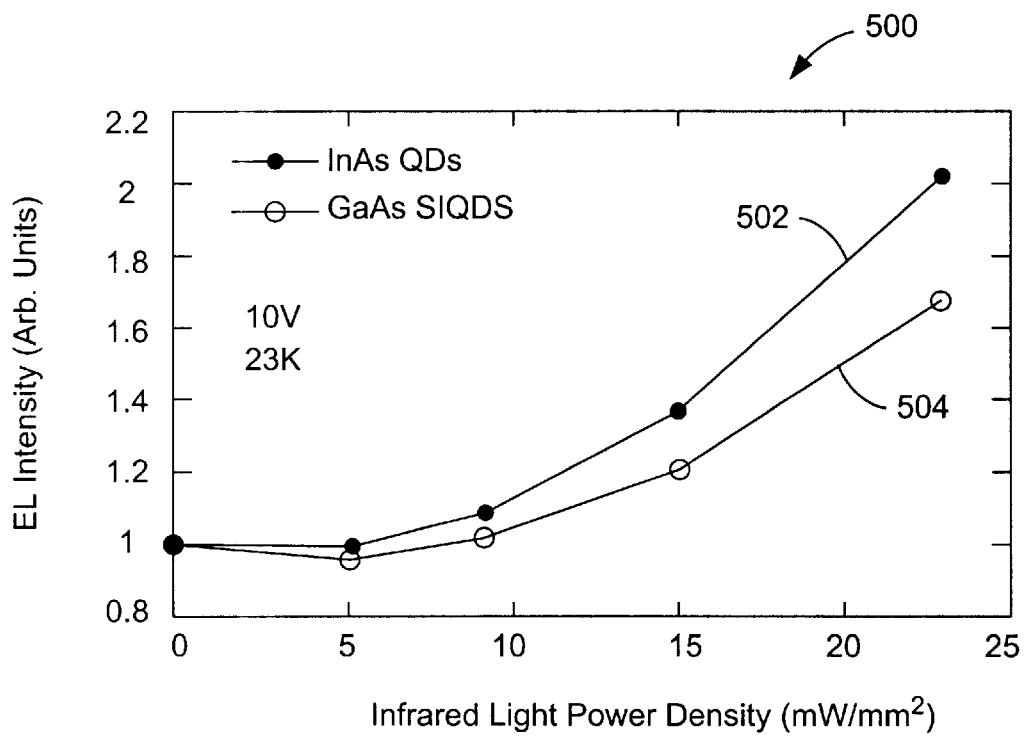
FIG. 5 illustrates the change in the electroluminescence as a function of infrared light power of the device of the present invention.

FIG. 5 illustrates the infrared light power of the device of the present invention. The infrared light power density graph 500 illustrates the density dependence 502 of the integrated electroluminesence of the GaAs SIQDs 114 and the density dependence 504 of the InAs quantum dots 108 at a 10 volt bias and a temperature of 23 Kelvin. Under infrared light (5–12 micron wavelength) illumination, an increase of the GaAs SIQDs 114 luminescence occurs. A 100% increase of near infrared light is present under illumination with 23 mW/mm$^2$ M&FIR light. The InAs quantum dots 108 luminescence is also observed to rise as a function of the incident IR power, which is attributed to the absorption of photons emitted by the GaAs SIQDs 114. In addition, part of the InAs quantum dots 108 emission increase is attributed to hole excitation and tunneling from the GaAs quantum wells or the SIQDs 114 to the InAs quantum dots 108. As shown in FIG. 4, decreasing the bias voltage reduces the intensity of the converted NIR light because of a lower tunneling probability between the InAs quantum dots and the SIQDs. At a 5 V bias, a 10% increase of the GaAs SIQDs 114 luminescence is observed. However, at a bias of 5 V, the electroluminescence from the InAs quantum dots 108 did not increase due to the low tunneling probability of the excited holes.

The present invention does not have a significant increase of the electron or lattice temperature. Moreover, upon increasing the temperature of the device, a decrease of the electroluminescence of the GaAs SIQDs 114 and the InAs quantum dots 108 is observed. This decrease is due to the presence of non radiative centers in the structure, because if an increase of the electron temperature was induced by the infrared radiation, the electroluminescence signal would increase with the temperature.

At a bias of 5 V the electroluminescence from the GaAs SIQDs 114 is already observed under no infrared illumination. This luminescence makes the signal to noise ratio small. By controlling the InAs quantum dots 108 growth, it is possible to push up the quantum levels in the InAs quantum dots 108, and by choosing the composition and thickness of the layers of the device to permit a very rapid relaxation of the photoexcited carriers from the InAs quantum dots 108 excited states through the X minimum in the $Al_{0.6}Ga_{0.4}As$ barrier into the ground state of the GaAs SIQD 114, the signal to noise ratio is improved.

Alternative Embodiments of the Present Invention

Although described with respect to GaAs/InAs materials systems, the present invention can be used with any materials system, including but not limited to any material system where quantum dots can be fabricated using MBE, MOCVD or MOMBE techniques, such as InP/GaInP, InGaAlAs/AlGaAs, InGaN/GaN, SiGe/Si, or other combinations of materials. The strain induced quantum dots 114 can be induced in any of the materials listed. The SiGe/Si system can be directly integrated to silicon CCD camera elements for ease of manufacture. Multiple conversions from one wavelength to another using multiple quantum dot/stress induced quantum dot excitations are also possible using the present invention. For example, a GaAs/InP system can be used to convert M&FIR wavelengths to near visible or visible wavelengths.

The stress induced quantum dot layer 110 can be replaced by a layer of coupled quantum dots which are coupled and close to the quantum dots 108. These coupled quantum dots have appropriate dimensions to efficiently achieve the upconversion described herein.

Logic

Figure 6:
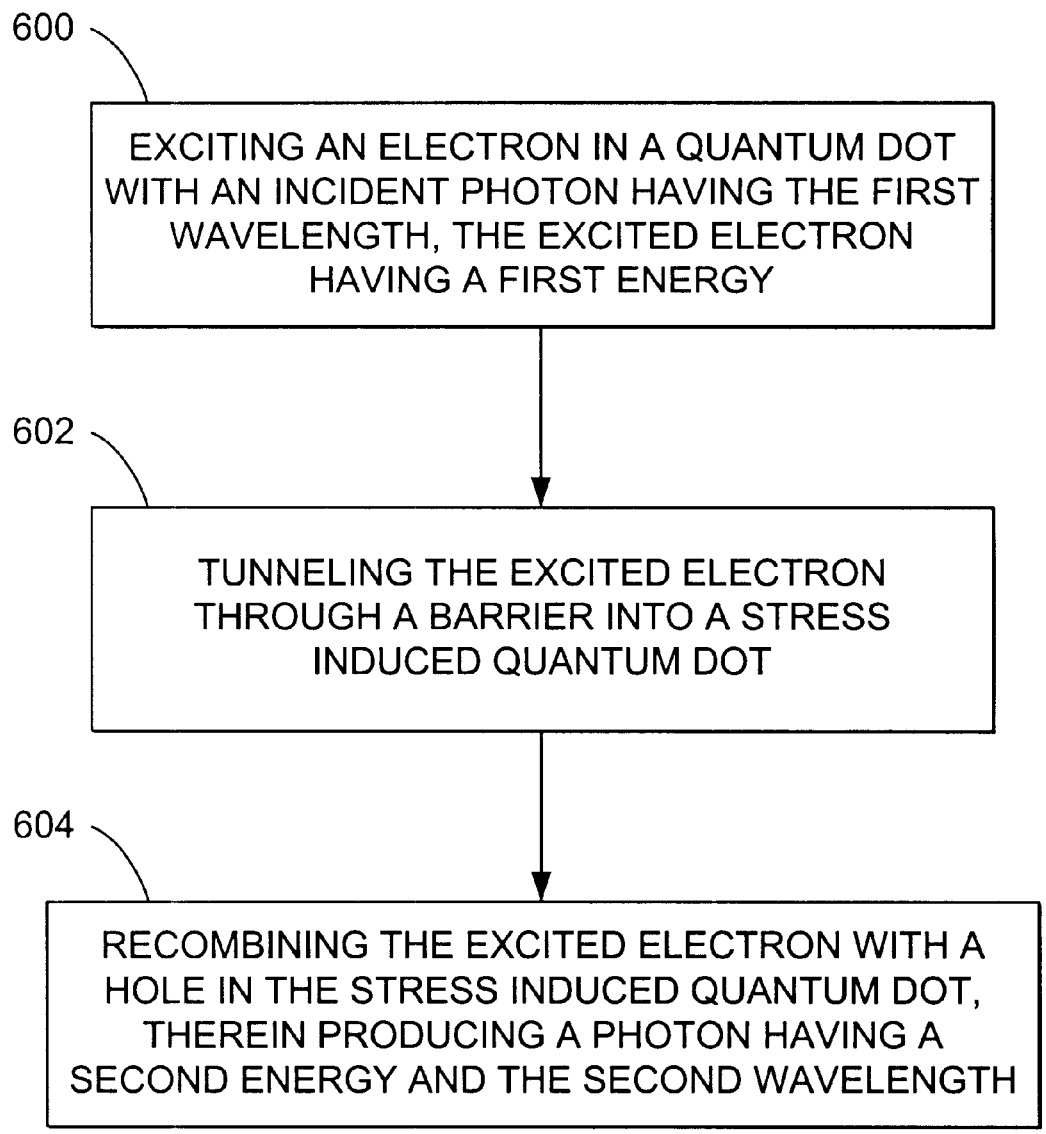
FIG. 6 is a flow chart illustrating the steps used in the present invention.

FIG. 6 is a flow chart illustrating the steps used in the present invention.

Block 600 represents performing the step of exciting an electron in a quantum dot with an incident photon having the first wavelength, the excited electron having a first energy.

Block 602 represents performing the step of tunneling the excited electron through a barrier into a stress induced quantum dot.

Block 604 represents performing the step of recombining the excited electron with a hole in the stress induced quantum dot, therein producing a photon having a second energy and the second wavelength.

Conclusion

In summary, the present invention provides a method for light conversion and a device for light conversion. The method comprises the steps of exciting an electron from a quantum dot with an incident photon having the first wavelength, the excited electron having a first energy, tunneling the excited electron through a barrier into a stress induced quantum dot, and recombining the excited electron with a hole in the stress induced quantum dot, therein producing a photon having a second energy and the second wavelength.

The device comprises a substrate, a spacer layer, coupled to the substrate, a second layer, coupled to the spacer layer, wherein the second layer comprises a different material than the spacer layer, a third layer, coupled to the second layer, wherein the third layer comprises at least one quantum dot, a fourth layer, coupled to the third layer, comprising a quantum well corresponding to each quantum dot in the third layer, a fifth layer, coupled to the fourth layer, wherein the fourth layer and fifth layer comprise a strain induced quantum dot corresponding to each quantum dot in the third layer; and a sixth layer, coupled to the fifth layer, the substrate and the sixth layer for contacting the device.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light converter, comprising:
   a substrate;
   a spacer layer, coupled to the substrate;
   a second layer, coupled to the spacer layer, wherein the second layer comprises a different material than the spacer layer;
   a third layer, coupled to the second layer, wherein the third layer comprises at least one quantum dot layer;
   a fourth layer, coupled to the third layer, wherein the fourth layer includes a quantum well corresponding to each quantum dot in the third layer;
   a fifth layer, coupled to the fourth layer, wherein the fourth layer and fifth layer include a strain induced quantum dot corresponding to each quantum dot in the third layer; and
   a sixth layer, coupled to the fifth layer, wherein the substrate and the sixth layer are contact layers for the light converter.

2. The light converter of claim 1, wherein the substrate is made of a material selected from a group comprising gallium aluminum arsenide, gallium indium phosphide, aluminum gallium arsenide, gallium nitride, and silicon.

3. The light converter of claim 1, wherein the quantum dot is made of a material selected from a group comprising indium arsenide, indium phosphide, indium gallium aluminum arsenide, indium gallium nitride, and silicon germanium.

4. The light converter of claim 1, wherein the strain induced quantum dots are induced in quantum wells in the fourth layer.

5. The light converter of claim 1, wherein the substrate and the sixth layer are doped with substantially opposite dopant types.

6. The light converter of claim 1, wherein the light converter is biased using an external voltage potential across the substrate and the sixth layer.

7. The light converter of claim 1, wherein the strain induced quantum dots are coupled quantum dots.

8. A light converter, comprising:
   a p-doped first contact layer;
   an n-doped second contact layer; and
   one or more layers, coupled between the p-doped first contact layer and the n-doped second contact layer, having at least one quantum dot and an associated quantum well, wherein the quantum dot induces a stress induced quantum dot in the associated quantum well when light of a first wavelength is incident on the quantum dot, thereby producing light of a second wavelegth from the stress induced quantum dot therein.

9. The light converter of claim 8, wherein the quantum dot is made of a material selected from a group comprising indium arsenide, indium phosphide, indium gallium aluminum arsenide, indium gallium nitride, and silicon germanium.

10. The light converter of claim 8, wherein the light converter is biased using an external voltage potential across the p-doped first contact layer and the n-doped second contact layer.

11. The light converter of claim 8, wherein the stress induced quantum dot is a coupled quantum dot.

* * * * *